United States Patent
Salberta (10) Patent No.: US 11,495,959 B2
(45) Date of Patent: Nov. 8, 2022

(54) SYSTEM AND METHOD FOR IMPROVED DETECTION OF INTERRUPTION OF POWER SUPPLIED BY AN AC MAINS TO A DEVICE

(71) Applicant: ARRIS Enterprises LLC, Suwanee, GA (US)

(72) Inventor: Frederick Salberta, Pipersville, PA (US)

(73) Assignee: ARRIS ENTERPRISES LLC, Suwanee, GA (US)

( * ) Notice: Subject to any disclaimer, the term of this patent is extended or adjusted under 35 U.S.C. 154(b) by 63 days.

(21) Appl. No.: 17/155,236

(22) Filed: Jan. 22, 2021

(65) Prior Publication Data

US 2021/0234363 A1 Jul. 29, 2021

Related U.S. Application Data (60) Provisional application No. 62/964,712, filed on Jan. 23, 2020.

(51) Int. Cl.
| | | |
|---|---|---|
| *H02H 3/00* | (2006.01) | |
| *H02H 3/44* | (2006.01) | |
| *G01R 21/133* | (2006.01) | |
| *H02H 1/00* | (2006.01) | |

(52) U.S. Cl.
CPC .......... *H02H 3/445* (2013.01); *G01R 21/133* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 2008/0231197 A1* | 9/2008 | Chiba ..................... | H01J 25/34 315/106 |
| 2011/0031911 A1* | 2/2011 | Marcinkiewicz ... | H02M 1/4225 318/400.3 |
| 2014/0002169 A1 | 1/2014 | Ramirez | |

FOREIGN PATENT DOCUMENTS

| | | |
|---|---|---|
| EP | 2 159 663 | 3/2010 |
| EP | 2 762 903 | 8/2014 |

OTHER PUBLICATIONS

International Search Report and Written Opinion of the International Searching Authority dated May 27, 2021 in International Application No. PCT/US2021/014487.

* cited by examiner

*Primary Examiner* — Stephen W Jackson
(74) *Attorney, Agent, or Firm* — Wenderoth, Lind & Ponack, L.L.P.

(57) ABSTRACT

Provided is a method for monitoring DC electrical power. The method including determining a rate of change of the DC electrical power, determining whether the rate of change of the DC electrical power is greater than a predetermined threshold, when the rate of change of the DC electrical power is greater than the predetermined threshold, determining whether the rate of change of the DC electrical power is greater than the predetermined threshold for a predetermined period of time, and when the rate of change of the DC electrical power is greater than the predetermined threshold for the predetermined period of time, sending a signal indicating an interruption in the DC electrical power.

18 Claims, 5 Drawing Sheets

SYSTEM AND METHOD FOR IMPROVED DETECTION OF INTERRUPTION OF POWER SUPPLIED BY AN AC MAINS TO A DEVICE

BACKGROUND

1. Technical Field

The subject matter of the present disclosure relates generally to detection of an interruption in power supplied by an AC mains to a device.

2. Description of the Related Art

Conventionally, in a system in which AC electrical power from an AC mains is converted to DC electrical power and supplied to a device, a simple detection circuit is integrated into the device to detect when a DC voltage input to the device falls below a threshold. For example, in a set-top box receiving an input voltage of 12 V DC, a detection circuit integrated into the set-top box is configured to detect when the input voltage falls below a threshold of 10.8 V, and when the input voltage falls below this threshold, the detection circuit sends a signal to a controller of the set-top box signifying interruption of the power supplied by the AC mains to the system. Upon receipt of the signal, the controller begin shutdown processing for the set-top box.

However, as applications executed by a device become more complex, the time needed to perform an orderly shutdown in response to interruption of power supplied to the device increases. For example, an orderly shutdown of a device may include writing data representing a state of the device at the time of shutdown to a non-transitory memory integrated into the device. As the applications executed by the device become more complex, an amount of data representing the state of the device at the time of shutdown increases and more time is required to write the data to the non-transitory memory. Accordingly, an improved technique in detecting interruption of power supplied by an AC mains to a device which leads to more time for the device to perform an orderly shutdown is desired.

BRIEF SUMMARY

According to an aspect of the present disclosure, a method is provided for monitoring DC electrical power. The method including determining a rate of change of the DC electrical power, determining whether the rate of change of the DC electrical power is greater than a predetermined threshold, when the rate of change of the DC electrical power is greater than the predetermined threshold, determining whether the rate of change of the DC electrical power is greater than the predetermined threshold for a predetermined period of time, and when the rate of change of the DC electrical power is greater than the predetermined threshold for the predetermined period of time, sending a signal indicating an interruption in the DC electrical power.

According to another aspect of the present disclosure, a circuit is provided for monitoring DC electrical power. The circuit including a differentiator operational amplifier that (i) receives the DC electrical power and (ii) outputs a first signal proportional to a rate of change of the DC electrical power, an integrator operational amplifier that (i) receives the first signal output by the differentiator operational amplifier and (ii) outputs a second signal proportional to a length of time that an absolute value of the rate of change of the DC electrical power is greater than zero based on the first signal received from the differentiator operational amplifier, and a logic circuit that (i) receives the first signal output by the differentiator operational amplifier and the second signal output by the integrator operational amplifier and (ii) outputs a third signal indicating an interruption in the DC electrical power based on a logical level of the first signal output by the differentiator operational amplifier and a logical level of the second signal output by the integrator operational amplifier.

As will be described below by way of example, the present disclosure provides an improved technique in detecting interruption of power supplied by an AC mains to a device, thereby providing additional time a device to perform an orderly shutdown compared to conventional techniques.

BRIEF DESCRIPTION OF THE DRAWINGS

In the drawings, like reference numbers generally indicate identical, functionally similar, and/or structurally similar elements.

DETAILED DESCRIPTION

The following detailed description is made with reference to the accompanying drawings and is provided to assist in a comprehensive understanding of various example embodiments of the present disclosure. The following description includes various details to assist in that understanding, but these are to be regarded as merely examples. Accordingly, those of ordinary skill in the art will recognize that various changes and modifications of the examples described herein can be made without departing from the spirit and scope of the present disclosure. In addition, descriptions of well-known functions and constructions may be omitted for clarity and conciseness.

The terms and words used in the following description are merely used to enable a clear and consistent understanding of the present disclosure. Accordingly, it should be apparent to those skilled in the art that the following description of the present disclosure is provided for illustration purposes only, and not for the purpose of limiting the present disclosure as defined by the appended claims and their equivalents.

Figure 1:
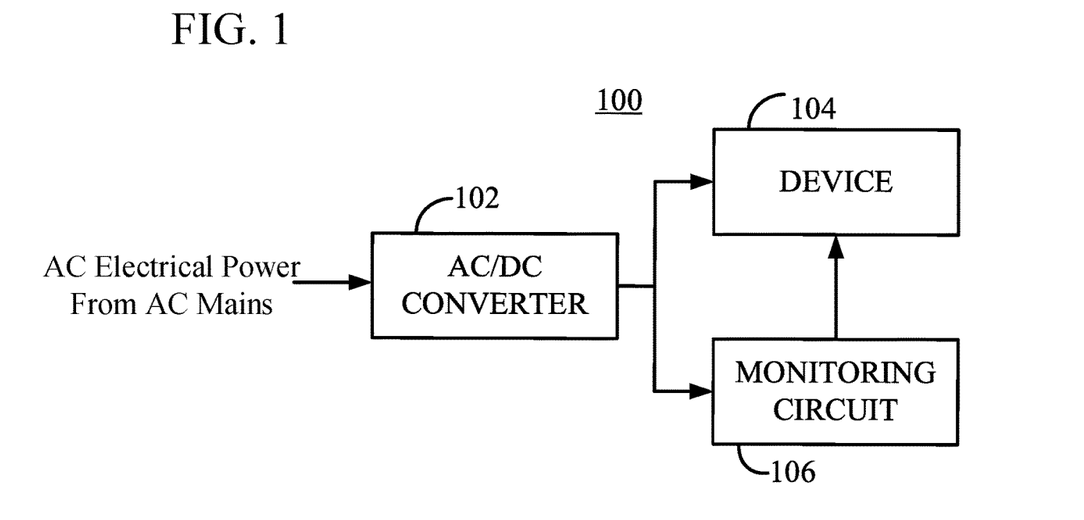
FIG. 1 illustrates a block diagram of a system for detection of an interruption in power supplied by an AC mains supplied to a device according to an embodiment of the present disclosure.

FIG. 1 illustrates a block diagram of a system 100 for detection of an interruption of power supplied by an AC mains power to a device according to an embodiment of the present disclosure.

As illustrated in FIG. 1, the system 100 includes an AC/DC converter 102 that receives AC electrical power from an AC mains and converts the AC electrical power into DC electrical power, a device 104 which receives the DC electrical power from the AC/DC converter 102, and a monitoring circuit 106 which monitors the DC electrical power output from the AC/DC converter 102 for interruptions in the supplied power.

AC electrical power is supplied to the system 100 by the AC mains in accordance with a nominal supply voltage for the region in which the system 100 is implemented. For example, when the system 100 is implemented in the United States, the AC mains supplies 120 V with a frequency of 60 Hz. However, it should be understood that system 100 is not limited to being implemented in the United States or in a region in which AC mains supplied 120 V with a frequency of 60 Hz.

The AC/DC converter 102 is connected to and converts the AC electrical power supplied by the AC mains to DC electrical power suitable to be used by the device 104. After converting the AC electrical power supplied by the AC mains to DC electrical power suitable to be used by the device 104, the AC/DC convertor 102 supplies the DC electrical power to the device 104.

An example of the AC/DC convertor 102 is a flyback convertor implemented in an AC adapter for converting the AC electrical power supplied by the AC mains to the DC electrical power suitable to be used by the device 104. Use of the flyback convertor provides an isolated circuit for performing the AC/DC conversion, and provides a predictable output voltage decay of the DC electrical voltage when the AC electrical power is no longer supplied by the AC mains.

The flyback converter performs AC/DC conversion as follows: rectifying and smoothing the high AC voltage received from the AC mains to obtain a high DC voltage; converting the high DC voltage to high-frequency square waves; stepping down the voltage of the high-frequency square waves across a transformer according to the target DC voltage; and on the secondary side of the transformer, subjecting the high-frequency square waves to rectifying and smoothing to obtain the target DC voltage. However, it should be understood that the AC/DC convertor 102 is not limited to being implemented using a flyback convertor, and it should be understood that it contemplated by the present disclosure that other known techniques and/or convertors may be utilized according to the needs of the implementation of the system 100.

The device 104 is connected to and receives the DC electrical power from the AC/DC convertor 102. As described below with reference to FIGS. 4 and 5, the device 104 may a set-top box including components and circuits that receive, store, convert, and transmit A/V content received from a content service provider. However, it should be understood that the present disclosure contemplates that the device 104 may be any type of complex set of circuitry that may benefit from additional time to perform shutdown activities in response to detection of interruption of the AC electrical power supplied by the AC mains to the system 100.

The monitoring circuit 106 is connected to the AC/DC convertor 102 and monitors the DC electrical power supplied by the AC/DC convertor 102 to the device 104. Specifically, the monitoring circuit 106 monitors a rate of change of the DC electrical power supplied by the AC/DC convertor 102 to the device 104, and when an absolute value of a negative rate of change of the DC electrical power is greater than a predetermined threshold for a predetermined period of time, the monitoring circuit 106 provides a signal to the device 104 indicating interruption of the AC electrical power supplied by the AC mains to the system 100.

The predetermined threshold and the predetermined period of time are set so that the negative rate of change of the DC electrical power indicates actual loss of the AC electrical power from the AC mains and not merely a fluctuation in the AC electrical power from AC mains, for example, a brown out, one or more lost AC cycles or portions of an AC cycle, or a surge line perturbation.

For example, as noted above, the use of a flyback convertor as the AC/DC convertor 102 provides a predictable output voltage decay of the DC electrical power when the AC electrical power is no longer supplied by the AC mains.

Based on this predictable output voltage decay, a rate of change of the voltage decay of the DC electrical power when the AC electrical power is no longer supplied by the AC mains can be derived. This derived rate of change of the voltage decay may be used to set the predetermined threshold, for example, the predetermined threshold could be set as an absolute value of the derived rate of change of the voltage decay or the predetermined threshold could be set as a value slightly lower than the absolute value of the derived rate of change of the voltage decay. Accordingly, the predetermined threshold can be set so that the negative rate of change of the DC electrical power indicates actual loss of the AC electrical power from the AC mains and not merely a fluctuation in the AC electrical power from AC mains, for example, a brown out, one or more lost AC cycles or portions of an AC cycle, or a surge line perturbation.

Based the signal received from the monitoring circuit 106, the device 104 may begin processing related to an orderly shutdown such as, for example, writing data representing a state of the device 104 at the time of shutdown to a non-transitory memory integrated into the device 104.

Figure 2:
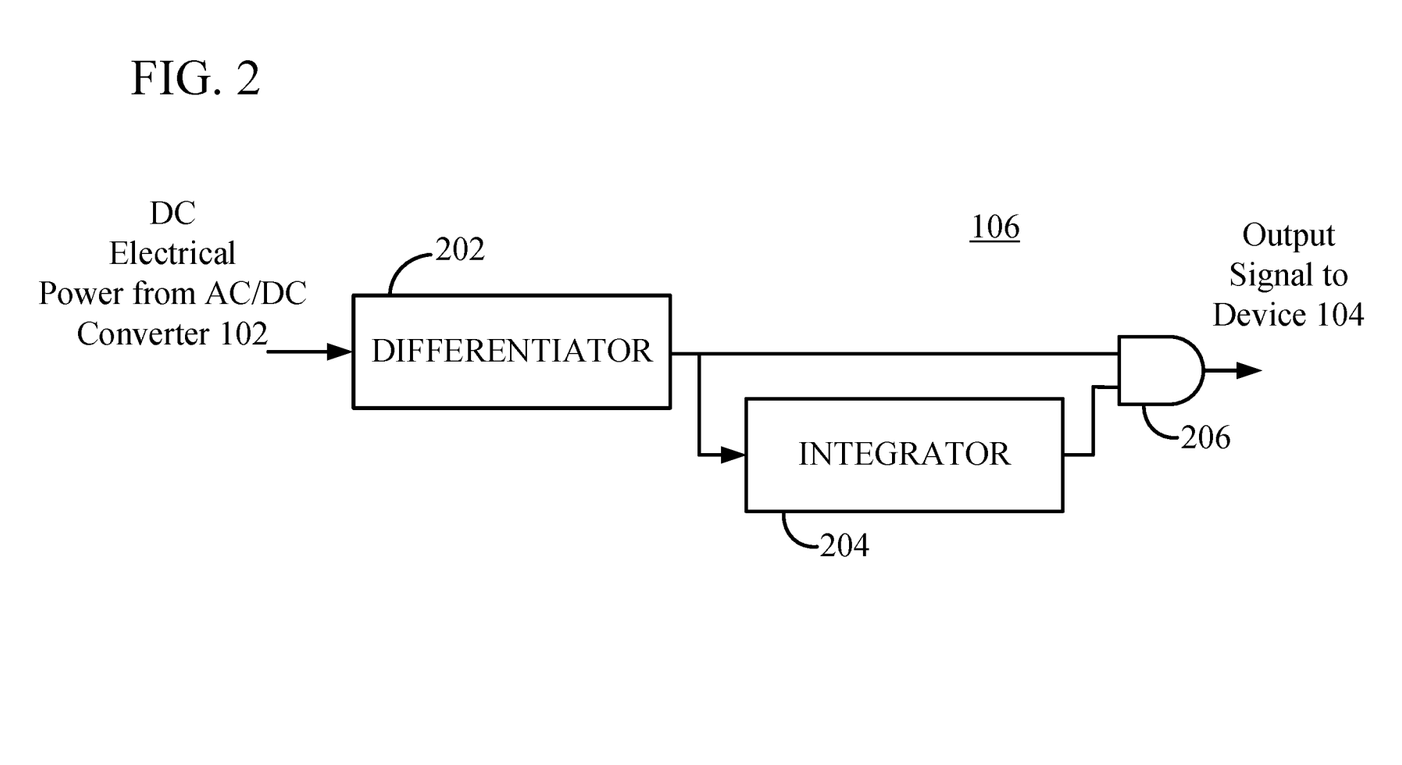
FIG. 2 illustrates a block diagram of an exemplary monitoring circuit for detecting an interruption in power supplied by an AC mains supplied to a device according to an embodiment of the present disclosure.

FIG. 2 illustrates a block diagram of an exemplary configuration of the monitoring circuit 106 included in the system 100 illustrated in FIG. 1. Specifically, the monitoring circuit 106 is implemented as a circuit including a differentiator 202, an integrator 204, and an AND gate 206.

The differentiator 202 receives the DC electrical power supplied by the AC/DC convertor 102 and converts a rate of change of the DC electrical power to produce an output voltage proportional to the rate of change of the DC electrical power. More specifically, a rate of change of the DC electrical power input to the differentiator 202 will result in the differentiator 202 outputting a voltage proportional to the rate of change.

The differentiator 202 may be configured as an inverting differentiator so that the greater a negative rate of change of the DC electrical power input to the inverting differentiator 202, the greater a positive voltage output from the inverting differentiator 202.

More specifically, the differentiator 202 may be configured as an inverting differentiator operational amplifier so that when a negative rate of change of the DC electrical power input to the inverting differentiator operational amplifier is greater than the predetermined threshold, the proportional output voltage of the inverting differentiator operational amplifier is sufficiently high so as to register a high signal at the input of the AND gate 206.

Accordingly, the differentiator 202 serves a function of detecting when the absolute value of the negative rate of change of the DC electrical power is greater than the predetermined threshold.

The output voltage of the differentiator 202 is input to integrator 204 which converts a length of time that the output voltage of the differentiator 202 is non-zero to produce an output voltage proportional to the integral of the output voltage of the differentiator 202. More specifically, the integrator 204 outputs a voltage proportional to the duration that the output voltage of the differentiator 202 has deviated from 0 V.

The integrator 204 may be configured so that the greater the duration of a positive voltage output from the differentiator 202, which is proportional to the negative rate of change of the DC electrical power input to the differentiator 202, the greater a positive voltage output from the integrator 204, that is, the integrator 202 may be configured as a non-inverting integrator.

More specifically, the integrator 204 is configured as a non-inverting integrator operational amplifier where the RC time constant of the non-inverting integrator operational amplifier is set so as to ensure that a long enough period has elapsed since the differentiator 202 has output positive voltage, which is output by the differentiator 202 when the absolute value of the negative rate of change of the DC electrical power is greater than the predetermined threshold.

In particular, the RC time constant of the non-inverting integrator operational amplifier may be set so that the time for the output voltage of the non-inverting integrator operational amplifier to become sufficiently high so as to register a high signal at the input of the AND gate 206 is long enough that no resumption of the AC electrical power from the AC mains is expected. A predetermined period of time sufficient to indicate that no resumption of the AC electrical power from the AC mains is expected may be set based on a length of a cycle of the AC electrical power or a discharge time of a power supply capacitor in the AC/DC convertor 102. Additionally, the predetermined period of time sufficient to indicate that no resumption of the AC electrical power from the AC mains is expected may be set by industry standards for the device 104.

The RC time constant of the non-inverting integrator operational amplifier may be the same as the RC time constant of the inverting differentiator operational amplifier. Alternatively, the RC time constant of the inverting differentiator operational amplifier and the RC time constant of the non-inverting integrator operational amplifier may be set independently of each other based on respective requirements of the inverting differentiator operational amplifier and the non-inverting integrator operational amplifier.

Accordingly, the integrator 204 serves a function of measuring a time from when the absolute value of the negative rate of change of the DC electrical power is greater than the predetermined threshold.

The output voltage of the differentiator 202 and the output voltage of the integrator 204 are logically "anded" together using an AND gate 206, with a high output of the AND gate 206 signaling detection of interruption of the AC electrical power supplied by the AC mains to the system 100. The high output of the AND gate 206 may feed a latch (not shown) that triggers an interrupt to the device 104 to stop processes and begin an orderly shutdown.

Figure 3:
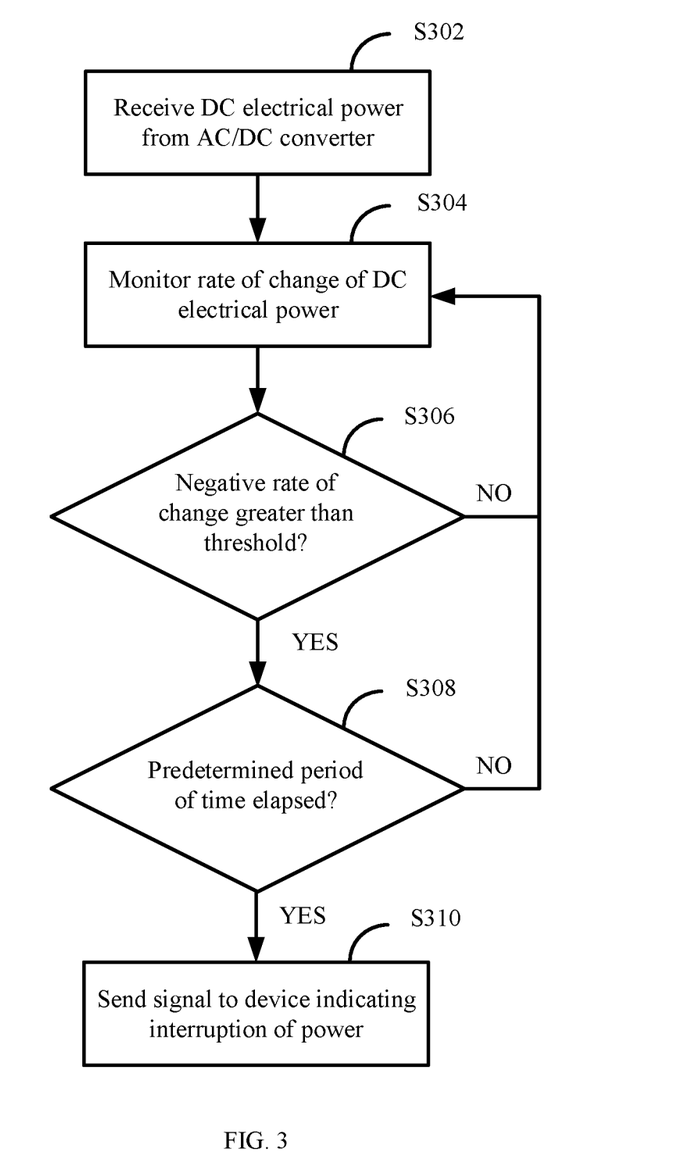
FIG. 3 illustrates a method for detection of an interruption in power supplied by an AC mains to a device according to an embodiment of the present disclosure.

FIG. 3 illustrates a method for detection of an interruption in power supplied by an AC mains supplied to a device according to an embodiment of the present disclosure.

At Step S302, the monitoring circuit 106 receives the DC electrical power supplied by the AC/DC convertor 102 as described above with respect to the system 100 illustrated in FIG. 1.

At Step S304, the monitoring circuit 106 monitors the DC electrical power supplied by the AC/DC convertor 102 for a power interruption. More specifically, the monitoring circuit 106 monitors a rate of change in the DC electrical power supplied by the AC/DC convertor 102, and when a negative rate of change of the DC electrical power is detected, the method proceeds to Step S306.

At Step S306, the monitoring circuit 106 determines whether or not an absolute value of the negative rate of change of the DC electrical power supplied by the AC/DC convertor 102 is greater than a predetermined threshold. As discussed above, based on the configuration of the AC/DC convertor 102, a rate of change of the voltage decay of the DC electrical power when the AC electrical power is no longer supplied by the AC mains can be derived, and this derived rate of change may be used to set the predetermined threshold so that the negative rate of change of the DC electrical power indicates actual loss of the AC electrical power from the AC mains and not merely a fluctuation in the AC electrical power from AC mains, for example, a brown out, one or more lost AC cycles or portions of an AC cycle, or a surge line perturbation.

When the absolute value of the negative rate of change of the DC electrical power supplied by the AC/DC convertor 102 does not exceed the predetermined threshold (NO at Step S306), the method returns to S304 and the monitoring circuit 106 continues to monitors the DC electrical power supplied by the AC/DC convertor 102.

When the absolute value of the negative rate of change of the DC electrical power supplied by the AC/DC convertor 102 is greater than the predetermined threshold (YES at Step S306), the method proceeds to Step S408 and the monitoring circuit 106 determines whether or not a predetermined period of time has elapsed since the absolute value of the negative rate of change in the DC electrical power supplied by the AC/DC convertor 102 has exceeded the predetermined threshold. As discussed above, the predetermined period of time is long enough that no resumption of the AC electrical power from the AC mains is expected, and the predetermined period of time may be set based on a length of a cycle of the AC electrical power or a discharge time of a power supply capacitor in the AC/DC convertor 102. Additionally, the predetermined period of time may be set by industry standards for the device 104.

When the predetermined period of time has not elapsed since the absolute value of the negative rate of change of the DC electrical power supplied by the AC/DC convertor 102 has exceeded the predetermined threshold (NO at Step S308), the method returns to S404 and the monitoring circuit 106 continues to monitors the DC electrical power supplied by the AC/DC convertor 102.

When the predetermined period of time has elapsed since the absolute value of the negative rate of change of the DC electrical power supplied by the AC/DC convertor 102 has exceeded the predetermined threshold (YES at Step S308), the method proceeds to Step 410 and the monitoring circuit 106 the monitoring circuit 106 send a signal to the device 104 indicating interruption of the AC electrical power supplied by the AC mains to the system 100, and the device 104 begins processing related to an orderly shutdown. As discussed above, an orderly shutdown of a device may include writing data representing a state of the device at the time of shutdown to a non-transitory memory integrated into the device 104.

Although the above description of FIG. 2 illustrates an exemplary configuration of the monitoring circuit 106 using hardware components, it should be understood that the function of the components of the monitoring circuit 106 illustrated in FIG. 2 and/or the method illustrated in FIG. 3 and described above are not limited to such configurations. That is, the above may be implemented as any combination of an apparatus, a system, an integrated circuit, and a computer program on a non-transitory computer readable recording medium. The one more processors may be implemented as an integrated circuit (IC), an application specific integrated circuit (ASIC), or large scale integrated circuit (LSI), system LSI, super LSI, or ultra LSI components that perform a part or all of the functions described herein.

The processes disclosed above constitute algorithms that can be effected by software, applications (apps, or mobile apps), or computer programs. The software, applications, computer programs can be stored on a non-transitory computer-readable medium for causing a computer, such as the one or more processors, to execute the processes described herein and shown in the drawing figures.

The term non-transitory computer-readable recording medium refers to any computer program product, apparatus or device, such as a magnetic disk, optical disk, solid-state storage device, memory, programmable logic devices (PLDs), DRAM, RAM, ROM, EEPROM, CD-ROM or other optical disk storage, magnetic disk storage or other magnetic storage devices, or any other medium that can be used to carry or store desired computer-readable program code in the form of instructions or data structures and that can be accessed by a general-purpose or special-purpose computer, or a general-purpose or special-purpose processor. Disk or disc, as used herein, includes compact disc (CD), laser disc, optical disc, digital versatile disc (DVD), floppy disk and Blu-ray disc. Combinations of the above are also included within the scope of computer-readable media.

Figure 4:
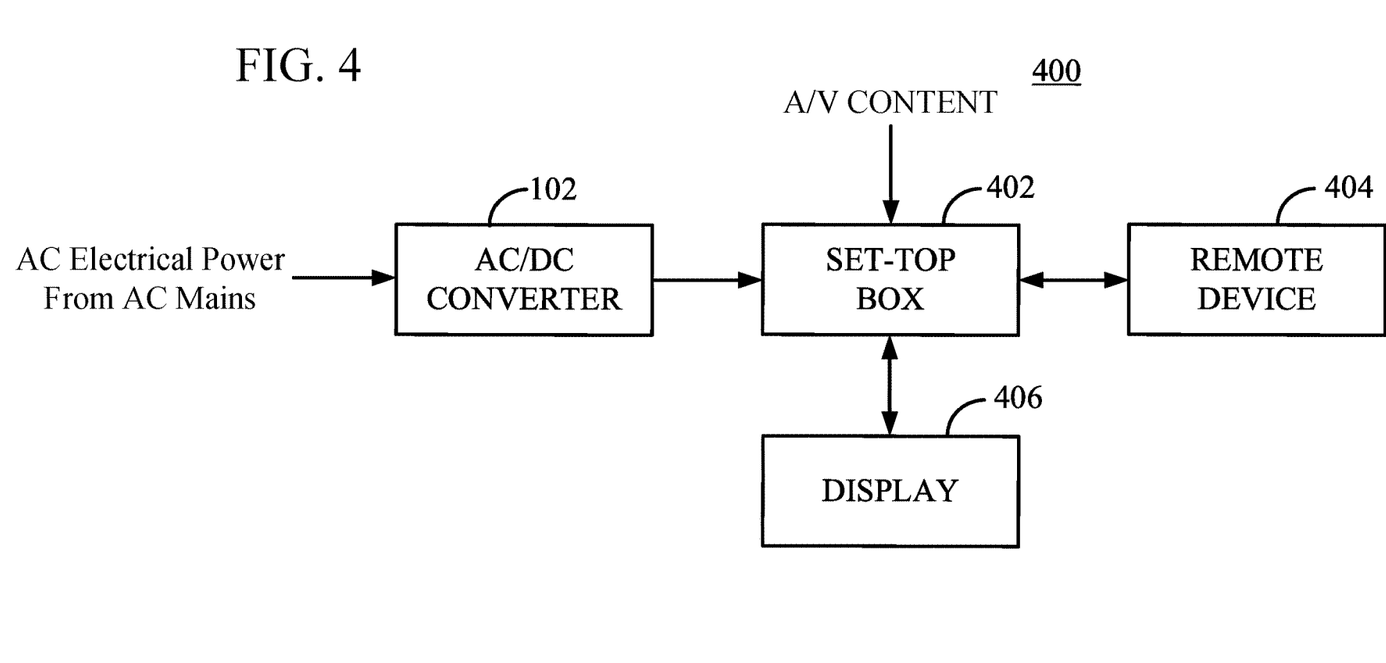
FIG. 4 illustrates a block diagram of a system for detection of an interruption in power supplied by an AC mains to a set-top box according to an embodiment of the present disclosure.

FIG. 4 illustrates a block diagram of a system 400 for detection of an interruption in power supplied by an AC mains to a set-top box according to an embodiment of the present disclosure. More specifically, the system 400 illustrated in FIG. 4 is a variation of the system 100 illustrated in FIG. 1 in which the device 104 is configured as a set-top box 402 and the monitoring circuit 106 is configured to be inside the set-top box 402.

As illustrated in FIG. 4, the system 400 includes an AC/DC converter 104 that receives AC electrical power from an AC mains and converts the AC electrical power into DC electrical power, a set-top box 402 which receives the DC electrical power from the AC/DC converter 104, a remote device 404, and a display 406. The AC electrical power received from the AC mains and the AC/DC convertor 102 have previously described above with respect to the system 100 illustrated in FIG. 1.

The set-top box 402 includes components and circuits that receive, store, convert, and transmit A/V content received from a content service provider. The set-top box 402 is further to configured to operate based on DC electrical power received from AC/DC adapter 104.

Additionally, it is contemplated by the present disclosure that the functions of the set-top box 402 can be implemented within another electronic device such as television, a computer, a portable device, an electronic tablet, or other digital receiver set. A description of each of the components of the set-top box 402 will be discussed in more detail with reference to FIG. 5.

The content service provider may include cable television providers, satellite television providers, internet service providers, and multiple system operators; and the A/V content may include television programming and movies. The information related to the A/V content may also include content entries published as part of a CDS, which contains a list of user resource identifiers (URIs) to the content (e.g., channels/live or recorded content) available for selection of the user of the set-top box 402.

The remote device 404 communicates wirelessly with the set-top box 402 using a wireless communication connection. The remote device 404 may be a stand-alone remote control, or any electronic device that can be implemented as a remote control for communicating data with the set-top box 402 using an Infrared (IR) signal or protocol sent via the wireless communication connection. Although the remote device 404 is described as a remote control device using an IR signal or protocol, it is contemplated by the present disclosure that other remote control devices can be implemented that use protocols such as, but not limited to, Bluetooth Audio/Video Remote Control Profile (AVRCP), RF4CE, ZigBee, Wi-Fi, and Z-Wave.

The display 406 may be a consumer device such as a television, a computer, a portable device, an electronic tablet, a smart phone, and other consumer electronic device capable to executing and displaying A/V content received from the set-top box 402.

The set-top box 402 communicates with the display 406 using a communication connection between the devices. The communication connection between the set-top box 402 and the display 406 may include, for example, a coaxial cable connection, a digital media interface (DMI), high-definition multimedia interface (HDMI) or other audio/video interface for transferring video data and digital audio data from an HDMI-compliant source device.

Alternatively, the communication connection between the set-top box 402 and the display 406 may also be a wireless connection that operates in accordance with, but is not limited to, IEEE802.11 protocol, a Radio Frequency For Consumer Electronics (RF4CE) protocol, ZigBee protocol, and/or IEEE802.15.4 protocol.

Further, the communication connection between the set-top box 402 and the display 406 may be wireless connections that operates in accordance with a Bluetooth protocol. That is, the communication connection operates in accordance with a wireless technology standard for exchanging data over short distances using short-wavelength Ultra high frequency (UHF) radio waves from 2.4 to 2.485 GHz.

Figure 5:
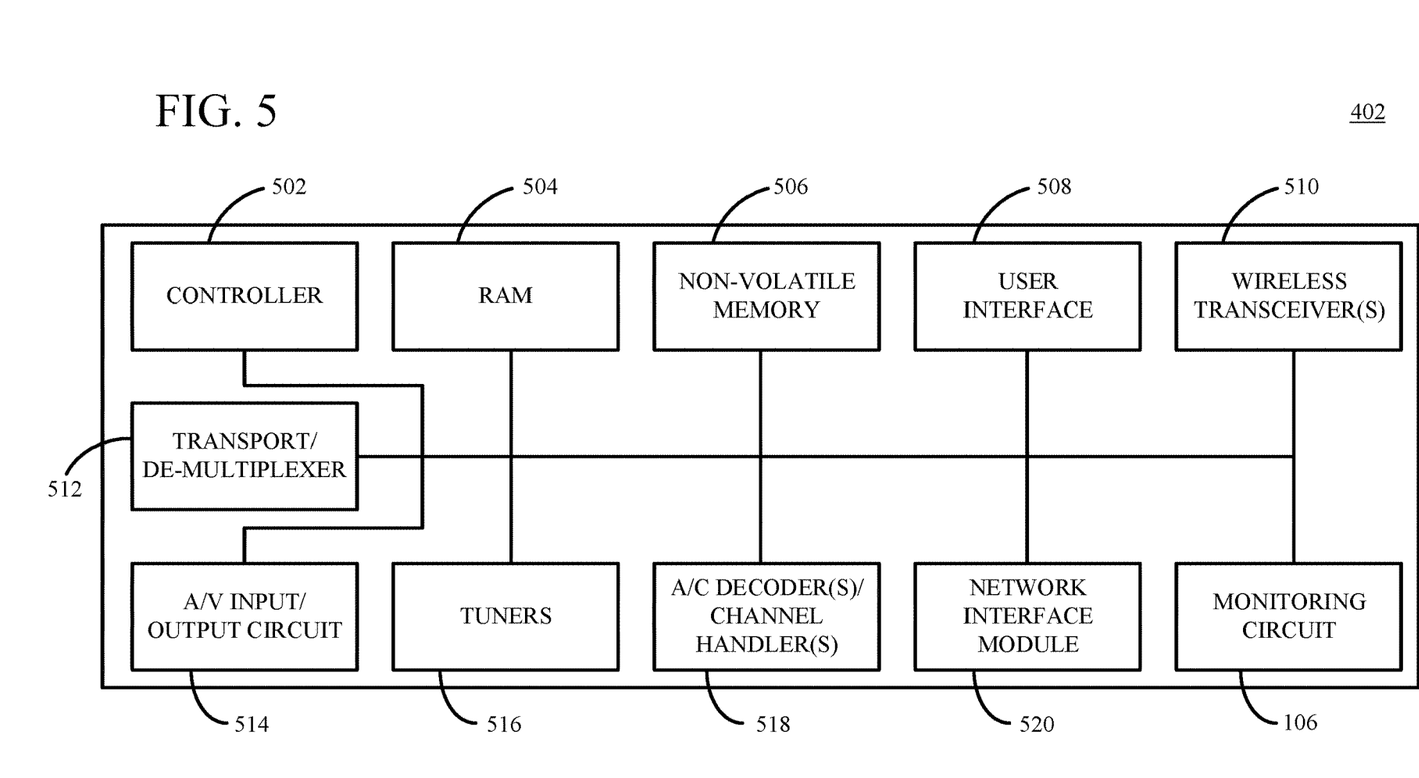
FIG. 5 illustrates a block diagram of an exemplary set-top box incorporating a monitoring circuit for detecting an interruption in power supplied by an AC mains to a device according to an embodiment of the present disclosure.

FIG. 5 illustrates a block diagram of an exemplary set-top box incorporating a monitoring circuit for detecting an interruption in power supplied by an AC mains to a device according to an embodiment of the present disclosure.

As illustrated in FIG. 5, the set-top box 402 includes a communication bus through which various components and circuits in the set-top box 402 are connected for communicating data there between. The set-top box 402 includes components and circuits for receiving, decoding, storing, converting, and outputting the A/V content to the display 406. It is contemplated by the present disclosure that the functions of the set-top box 402 can be implemented within another electronic device such as television, a computer, a portable device, an electronic tablet, or other digital receiver set. The components of the set-top box 402 include a controller 502, a random access memory (RAM) 504, a non-volatile memory 506, a user interface 508, wireless transceivers 510, a transport/demultiplexer 512, an A/V input/output circuit 514, tuners 516, A/V decoders/channel handlers 518, network interface module (NIM) 520, and monitoring circuit 106.

The controller 502 may be a dedicated controller, CPU, microprocessor, etc., capable of controlling the operation of the components and circuits of the set-top box 402. The RAM 504 may be implemented as a working memory for the controller 502 and the non-volatile memory 506 can be provided for storage of program code or software for performing an orderly shutdown in response to receiving a signal from the monitoring circuit 106 indicating interruption of the AC electrical power supplied by the AC mains to the system, A/V content, client device format capability information, and other similar data. However, it is also contemplated that the RAM 504 memory can be provided for storage of program code or software for performing an orderly shutdown in response to receiving a signal from the monitoring circuit 106 indicating interruption of the AC electrical power supplied by the AC mains to the system, A/V content, client device format capability information, and other similar data.

The user interface 508 provides a means for inputting instructions directly to the set-top box 402. The user interface 508 may include, but is not limited to, keys, buttons, knobs, or other similar input devices that can be used to input instructions for controlling operations on the set-top box 402. The user interface 508 may also include an IR receiver that can be implemented with the remote device 404 operating as a remote control for communicating instructions and data with the set-top box 402 using an IR signal or other wireless protocol sent via the wireless communication connection between the set-top box 402 and the remote device 404.

Although user interface 508 is described as operating with a remote control (e.g., remote device 404) using an IR signal or protocol, it is contemplated by the present disclosure that the remote device 404 can be implemented using wireless protocols such as, but not limited to, Bluetooth AVRCP, RF4CE, ZigBee, Wi-Fi, and Z-Wave.

The wireless transceivers 510, for example, includes a Wi-Fi WLAN interface radio transceiver, or an in-home LTE (Long Term Evolution) transceiver that outputs signals of the selected channel to a wireless user device. The wireless output from the wireless transceivers can be in place of or in addition to the wired output by the A/V input/output circuit 514. The A/V content from the content service provider can be received by a separate electronic device, such as a cable modem, or a set-top box, and communicated to the set-top box 402 wirelessly via the wireless transceivers 510.

The wireless transceivers 510 may also include a transceiver that operates in accordance with a Bluetooth protocol operating in accordance with a wireless technology standard for exchanging data over short distances using short-wavelength Ultra high frequency (UHF) radio waves from 2.4 to 2.485 GHz.

The transport/demultiplexer 512 receives the audio and video data from a channel and filters the video data of the A/V content of the program associated with the selected secondary channel. That is, the A/V content is transmitted as data packets that include packet identifiers (PIDs) that denote the type of data that the packets contain, and the transport/demultiplexer 512 includes a PID filter that filters the video data. The filtered video data is then sent to the A/V decoders/channel handlers 518 for further processing.

The A/V input/output circuit 514 includes one or more connectors, such as coaxial cable connectors, RF connectors or Ethernet connectors. One of the connectors of the A/V input/output circuit 514 can be connected to a content service provider, such as a multiple system operator (MSO), by terrestrial antenna, satellite dish, or wired cable. Through this connector of the A/V input/output circuit 514, the set-top box 402 receives the A/V content from the content service provider. Additionally, one of the connectors of the A/V input/output circuit 514 can be used to send data to the content service provider.

The A/V input/output circuit 514 can also include a connector that is to be connected to display 406 for transmitting the A/V content received by the content service provider and decoded by the A/V decoders included in the A/V decoders/channel handlers 518 of the set-top box 402.

The tuners 516 tune selected channels for receiving A/V content based on the input instruction received using the user interface 508 on the set-top box 402. For example, the tuners 516 convert a radio frequency digital television transmission into audio and video data signals which can be further processed to produce sound and a picture. The tuners 516 are implemented to tune different television standard formats (e.g., PAL, NTSC, ATSC, SECAM, DVB-C, DVB-T, DVB-T2, ISDB, T-DMB, and open cable). It is contemplated by the present disclosure that the tuners 516 include a first tuner that tunes the selected primary channel and a second tuner that tunes the one or more selected secondary channels. However, it is also contemplated by the present disclosure that the A/V content of the selected primary channel can be pre-recorded (e.g., DVR device) and therefore can be received by the set-top box 402 (e.g., input circuit, network interface module, wireless transceiver, etc) without the need to tune the selected primary channel (i.e., tuning by a tuner is not necessary).

It is contemplated by the present disclosure that the tuners 516 include a second tuner can perform internet video streaming. Additionally, it is contemplated by the present disclosure that there are multiple tuners implemented for tuning multiple selected secondary channels, and closed captioning or subtitle data can be extracted from the multiple secondary channels.

The A/V decoders/channel handlers 518 decode the selected signal so that the A/V content is usable by the display 406. It is contemplated by the present disclosure that the A/V decoders/channel handlers 518 are capable of processing the A/V content into multiple data formats.

The network interface module (NIM) 520 is implemented so as to provide standardized functions such as passing messages, connecting, and disconnecting between an IP source and the set-top box 402.

The monitoring circuit 106 monitors the DC electrical power supplied by the AC/DC convertor 102 to the device set-top box 402. As previously described in detail above, the monitoring circuit 106 monitors a rate of change of the DC electrical power supplied by the AC/DC convertor 102 to the set-top box 402, and when an absolute value of a negative rate of change of the DC electrical power is greater than a predetermined threshold for a predetermined period of time, the monitoring circuit 106 provides a signal to the controller 502 indicating interruption of the AC electrical power supplied by the AC mains to the system 500.

As described above by way of example, the present disclosure provides an improved technique in detecting interruption of power supplied by an AC mains to a device, thereby providing additional time a device to perform an orderly shutdown compared to conventional techniques.

Use of the phrases "capable of," "capable to," "operable to," or "configured to" in one or more embodiments, refers to some apparatus, logic, hardware, and/or element designed in such a way to enable use of the apparatus, logic, hardware, and/or element in a specified manner.

The subject matter of the present disclosure is provided as examples of systems and method for performing the features described in the present disclosure. However, further features or variations are contemplated in addition to the features described above. It is contemplated that the implementation of the components and functions of the present disclosure can be done with any newly arising technology that may replace any of the above implemented technologies.

Additionally, the above description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

Various modifications to the disclosure will be readily apparent to those skilled in the art, and the generic principles defined herein may be applied to other variations without departing from the spirit or scope of the present disclosure. Throughout the present disclosure the terms "example," "examples," or "exemplary" indicate examples or instances and do not imply or require any preference for the noted examples. Thus, the present disclosure is not to be limited to the examples and designs described herein but is to be accorded the widest scope consistent with the principles and novel features disclosed.

The invention claimed is:

1. A method for monitoring DC electrical power, the method comprising:
   determining a rate of change of the DC electrical power;
   determining whether the rate of change of the DC electrical power is greater than a predetermined threshold;
   when the rate of change of the DC electrical power is greater than the predetermined threshold, determining whether the rate of change of the DC electrical power is greater than the predetermined threshold for a predetermined period of time;
   when the rate of change of the DC electrical power is greater than the predetermined threshold for the predetermined period of time, sending a signal indicating an interruption in the DC electrical power; and
   wherein the determining whether the rate of change of the DC electrical power is greater than the predetermined threshold includes determining whether an absolute value of the rate of change of the DC electrical power is greater than the predetermined threshold.

2. The method according to claim 1,
   wherein in the determining the rate of change of the DC electrical power, the rate of change is a negative rate of change of the DC electrical power.

3. The method according to claim 2,
   wherein the DC electrical power is obtained by converting AC electrical power supplied by an AC mains to the DC electrical power, and
   wherein the predetermined threshold is set based on a voltage decay of the DC electrical power when the AC electrical power is no longer supplied by the AC mains.

4. The method according to claim 3, wherein the predetermined threshold is set based on a rate of change of the voltage decay of the DC electrical power when the AC electrical power is no longer supplied by the AC mains.

5. The method according to claim 1,
   wherein the DC electrical power is obtained by converting AC electrical power supplied by an AC mains to the DC electrical power, and
   wherein the predetermined period of time is set based on a length of a cycle of the AC electrical power supplied by the AC mains.

6. The method according to claim 1,
   wherein in the determining the rate of change of the DC electrical power, the rate of change is a negative rate of change of the DC electrical power,
   wherein the determining whether the rate of change of the DC electrical power is greater than the predetermined threshold includes determining whether an absolute value of the negative rate of change of the DC electrical power is greater than the predetermined threshold,
   wherein the DC electrical power is obtained by converting AC electrical power supplied by an AC mains to the DC electrical power,
   wherein the predetermined threshold is set based on a rate of change of the voltage decay of the DC electrical power when the AC electrical power is no longer supplied by the AC mains, and
   wherein the predetermined period of time is set based on a length of a cycle of the AC electrical power supplied by the AC mains.

7. The method according to claim 1, wherein the sending the signal indicating the interruption in the DC electrical power is an interrupt signal for causing a device to perform processes related to shutdown of the device.

8. A circuit for monitoring DC electrical power, the circuit comprising:
   a differentiator operational amplifier that (i) receives the DC electrical power and (ii) outputs a first signal proportional to a rate of change of the DC electrical power;
   an integrator operational amplifier that (i) receives the first signal output by the differentiator operational amplifier and (ii) outputs a second signal proportional to a length of time that an absolute value of the rate of change of the DC electrical power is greater than zero based on the first signal received from the differentiator operational amplifier; and
   a logic circuit that (i) receives the first signal output by the differentiator operational amplifier and the second signal output by the integrator operational amplifier and (ii) outputs a third signal indicating an interruption in the DC electrical power based on a logical level of the first signal output by the differentiator operational amplifier and a logical level of the second signal output by the integrator operational amplifier.

9. The circuit according to claim 8, wherein the differentiator operational amplifier is configured such that when an absolute value of a negative rate of change of the DC electrical power is greater than a predetermined threshold, the first signal output by the differentiator operational amplifier registers a logical high level at the logic circuit.

10. The circuit according to claim 9,
    wherein the DC electrical power is obtained by converting AC electrical power supplied by an AC mains to the DC electrical power, and
    wherein the predetermined threshold is set based on a voltage decay of the DC electrical power when the AC electrical power is no longer supplied by the AC mains.

11. The circuit according to claim 10, wherein the predetermined threshold is set based on a rate of change of the voltage decay of the DC electrical power when the AC electrical power is no longer supplied by the AC mains.

12. The circuit according to claim 8,
    wherein the integrator operational amplifier is configured such that when the first signal output by the differentiator operational amplifier is non-zero for a predetermined period of time, the second signal output by the integrator operational amplifier registers a logical high level at the logic circuit.

13. The circuit according to claim 12,
wherein the DC electrical power is obtained by converting AC electrical power supplied by an AC mains to the DC electrical power, and
wherein the predetermined period of time is set based on a length of a cycle of the AC electrical power supplied by the AC mains.

14. The circuit according to claim 8,
wherein the logic circuit outputs the third signal indicating the interruption in the DC electrical power when (i) the first signal output by the differentiator operational amplifier registers a logical high level and (ii) the second signal output by the integrator operational amplifier registers a logical high level.

15. The circuit according to claim 8,
wherein the DC electrical power is obtained by converting AC electrical power supplied by an AC mains to the DC electrical power,
wherein the differentiator operational amplifier is configured such that when an absolute value of a negative rate of change of the DC electrical power is greater than a predetermined threshold, the first signal output by the differentiator operational amplifier registers a logical high level at the logic circuit,
wherein the predetermined threshold is set based on a voltage decay of the DC electrical power when the AC electrical power is no longer supplied by the AC mains,
wherein the integrator operational amplifier is configured such that when the first signal output by the differentiator operational amplifier is non-zero for a predetermined period of time, the second signal output by the integrator operational amplifier registers a logical high level at the logic circuit,
wherein the predetermined period of time is set based on a length of a cycle of the AC electrical power supplied by the AC mains, and
wherein the logic circuit outputs the third signal indicating the interruption in the DC electrical power when (i) the first signal output by the differentiator operational amplifier registers a logical high level and (ii) the second signal output by the integrator operational amplifier registers a logical high level wherein the DC electrical power is obtained by converting AC electrical power supplied by an AC mains to the DC electrical power.

16. The circuit according to claim 8, wherein the signal indicating the interruption in the DC electrical power is an interrupt signal for causing a device to perform processes related to shutdown of the device.

17. A system comprising:
an AC/DC convertor for converting AC electrical power supplied by an AC mains to DC electrical power, and outputting the DC electrical power;
the circuit according to claim 8, the circuit monitoring the DC electrical power output by the AC/DC convertor; and
a device for receiving the signal indicating the interruption in the DC electrical power output by the AC/DC convertor.

18. The system according to claim 17, wherein the device is a set-top box in which the circuit monitoring the DC electrical power output by the AC/DC convertor is integrated.

* * * * *